(12) United States Patent
Kajiyama et al.

(10) Patent No.: US 7,718,511 B2
(45) Date of Patent: May 18, 2010

(54) PROCESSING METHOD FOR WAFER

(75) Inventors: Keiichi Kajiyama, Tokyo (JP);
Takatoshi Masuda, Tokyo (JP)

(73) Assignee: Disco Corporation, Tokyo (JP)

( * ) Notice: Subject to any disclaimer, the term of this patent is extended or adjusted under 35 U.S.C. 154(b) by 290 days.

(21) Appl. No.: 11/728,931

(22) Filed: Mar. 27, 2007

(65) Prior Publication Data

US 2007/0231929 A1 Oct. 4, 2007

(30) Foreign Application Priority Data

Mar. 29, 2006 (JP) ............................. 2006-090097

(51) Int. Cl.
*H01L 21/00* (2006.01)

(52) U.S. Cl. ..................... 438/460; 438/6; 438/704; 257/E21.503; 257/E21.508

(58) Field of Classification Search ................. 438/460, 438/6, 704; 257/737, 778, 781, E21.503, 257/E21.508
See application file for complete search history.

(56) References Cited

U.S. PATENT DOCUMENTS 6,797,632 B1 * 9/2004 Nakano et al. .............. 438/704

2003/0080420 A1 * 5/2003 Ohara ......................... 257/737
2005/0221584 A1 * 10/2005 Arai ............................ 438/458

FOREIGN PATENT DOCUMENTS

| JP | 2004-281551 | 10/2004 |
|----|-------------|---------|
| JP | 2005-123425 | 5/2005 |

* cited by examiner

*Primary Examiner*—Charles D Garber
*Assistant Examiner*—Abdulfattah Mustapha
(74) *Attorney, Agent, or Firm*—Brinks Hofer Gilson & Lione

(57) ABSTRACT

A processing method for a wafer includes: preparing a wafer which has a device region having plural devices formed on a surface of the wafer; and a peripheral reinforcing portion which is integrally formed around the device region and has a projection projecting outwardly on a rear surface of the wafer. The processing method further includes: holding the wafer on a holding surface of a rotatable holding table such that the rear surface of the wafer is exposed and the surface of the wafer closely contacts the holding table. The processing method further includes: thinning the peripheral reinforcing portion by cutting and removing at least the projection of the peripheral reinforcing portion of the wafer by using a cutting tool having a rotational shaft parallel to the holding surface, while rotating the wafer by rotating the holding table after the holding of the wafer. The peripheral reinforcing portion is thinned so as to have a thickness equal to or thinner than that of the device region by the thinning.

6 Claims, 8 Drawing Sheets

Fig. 6A
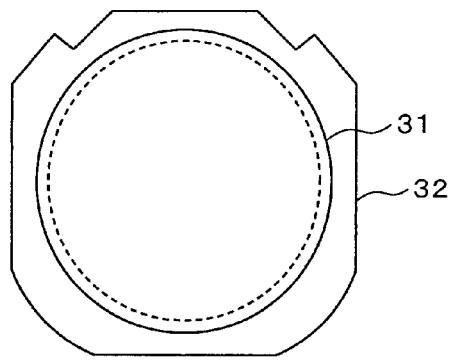
Fig. 6B
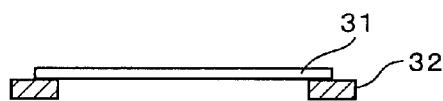
Fig. 7A  Fig. 7B  Fig. 7C  Fig. 7D
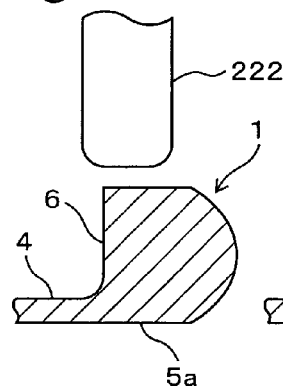 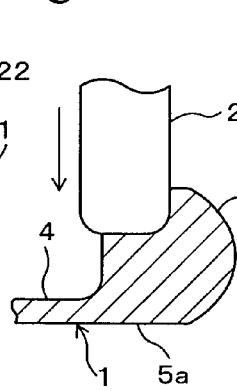 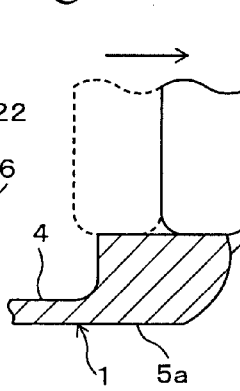 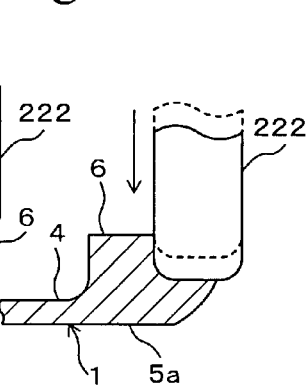
Fig. 7E  Fig. 7F  Fig. 7G  Fig. 7H
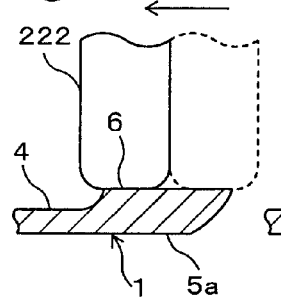 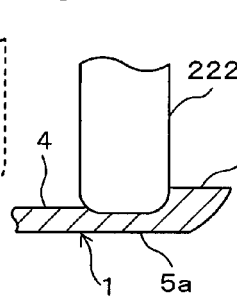 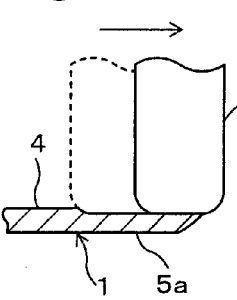 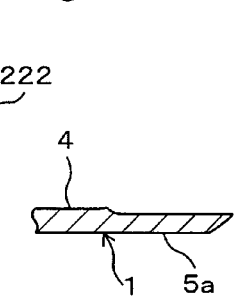

PROCESSING METHOD FOR WAFER

This application claims priority under 35 U.S.C. §119 to Japanese Patent Application No. JP2006-090097 filed Mar. 29, 2006, the entire content of which is hereby incorporated by reference.

BACKGROUND OF THE INVENTION

1. Field of the Invention

The present invention relates to a processing method in which a peripheral reinforcing portion of a wafer (for example, a semiconductor wafer), which is formed around a device region of the wafer having devices (for example, semiconductor chips) formed thereon and is thicker than the device region, is removed from the wafer.

2. Description of the Related Art

In general, semiconductor chips, which are used in various electronic apparatuses, are produced by the following method. That is, grid-like rectangular regions are defined by predetermined division lines on a disc-shaped semiconductor wafer, and electronic circuits are formed on surfaces of the rectangular regions. Next, a rear surface of the wafer is ground so as to be thinned. The wafer is divided along the predetermined division lines. As a result, semiconductor chips are produced. In recent years, electronic apparatuses have been greatly improved in compactness and thinness. In accordance with this, semiconductor chips are required to be even thinner, and semiconductor wafers are required to be thinner than previously.

When a semiconductor wafer is thinned, the rigidity of the semiconductor wafer is decreased. Due to this, it is difficult to handle the semiconductor wafer after the thinning, and cracking easily occurs in the semiconductor wafer. In order to solve these problems caused by the thinning, only the rear surface of circular device region, which has semiconductor chips formed on the surface, is ground so as to be thinned, and a ring-shaped peripheral extra region around the device region is thereby formed as a relatively thick reinforcing portion. In this case, since the rear surface is ground, the thick peripheral reinforcing portion projects on the rear surface, and the entire semiconductor wafer has a recessed shape in cross section. The technique, in which only the peripheral portion is allowed to be thick, has been disclosed in Japanese Unexamined Patent Applications Publication Nos. 2004-281551 and 2005-123425.

In conventional techniques, in order to easily handle a thinned semiconductor wafer, a protective tape was applied to a surface of the semiconductor wafer so as to provide rigidity thereto. However, when a metal film composed of gold is provided by a method (for example, deposition or sputtering) on a rear surface of the semiconductor wafer after thinning, the protective tape has insufficient heat-resistance, so that the processing temperature needs to be lower. Due to this, processing is more time-consuming in this case than in normal cases. In contrast, in the above rigidity improvement technique by formation of a peripheral reinforcing portion, since the rigidity is maintained even when the protective tape is peeled from the semiconductor wafer after the thinning, the above rigidity improvement technique by formation of a peripheral reinforcing portion is superior in that deposition or sputtering can be performed without consideration of heat effects.

In the above manner, the semiconductor wafer is finally divided into plural semiconductor chips. In this case, a typical dividing method for semiconductor wafer is a method in which a semiconductor wafer, which is chucked and held on a vacuum chuck-type table, is cut off by a cutting blade. In this method, a rear surface of the semiconductor wafer is applied to and supported by an adhesive surface of a dicing tape which is provided to a ring-shaped dicing frame, and the dicing tape is chucked on the chuck table. As a result, the semiconductor wafer is supported by the chuck table.

In this case, if the semiconductor wafer has a typical plate shape, the entire rear surface of the semiconductor wafer closely contacts the chuck table, so that the semiconductor wafer is stably held. However, when the semiconductor wafer has the above peripheral reinforcing portion, it is difficult to stably hold the semiconductor wafer. In order to solve this problem, it was conceived that the chuck table could be modified to have a shape to which the recessed rear surface of the semiconductor wafer having the above peripheral reinforcing portion is fitted. However, since this modification of the chuck table is not practical, the above peripheral reinforcing portion of the semiconductor wafer is removed, so that the entire semiconductor wafer is processed to have a plate shape.

In a method for removing a peripheral reinforcing portion, as shown in FIGS. 9 and 10, a semiconductor wafer 1 applied on a dicing tape 501 is held on a rotating chuck table, and a cutting blade 502 for dividing the semiconductor wafer 1 into semiconductor chips cuts a circular boundary between a device region 4 and a peripheral reinforcing portion 5a. Next, for example, the semiconductor wafer 1 is rotated by rotating the chuck table 501, so that the peripheral reinforcing portion 5a is cut off. However, in this method, since a cut width 502a by the cutting blade 502 is wider than an edge thickness of the cutting blade 502 due to difference between an inner circumference and an outer circumference of the cutting blade 502, a peripheral portion of the device region 4 is also subjected to the cutting, so that outer diameter of the device region 4 becomes small. As a result, the number of the obtained semiconductor chip becomes small, that is, the yield of the semiconductor chips becomes small.

In order to solve the above problem, as shown in FIGS. 11 and 12, in another method for removing a peripheral reinforcing portion, while a semiconductor wafer 1 is rotated by rotating a chuck table 503, and a grinding wheel 504 having a rotational shaft parallel to that of the chuck table 503 is rotated, plural grinding stones 505 are pressed on a peripheral reinforcing portion 5a, so that the peripheral reinforcing portion 5a is cut and removed. It was conceived that this method was advantageous since the above problem due to the difference between the inner circumference and the outer circumference of the cutting blade 502 was not caused. However, in this method, it is necessary to control the center distance between the chuck table 503 and the grinding wheel 504 with high precision. That is, it is necessary that outermost circumferential edge of rotation locus of the rotating grinding stones 505 corresponds to a boundary between the device region 4 and the peripheral reinforcing portion 5a of the semiconductor wafer 1. Even if the outermost circumferential edge thereof is positioned slightly insider than the boundary between the device region 4 and the peripheral reinforcing portion 5a on the semiconductor wafer 1, the peripheral portion of the device region 4 is ground. Due to this, semiconductor chips on the cut peripheral portion thereof cannot be used, and the yield of the semiconductor chips is decreased. However, this method does not have a function for recognizing and controlling the position of rotation locus of edges of the grinding stones 505, and the grinding stones 505 are away from the rotational shaft of the grinding wheel 504. As a result, in practice, it is difficult to control grinding points of the grinding stones 505 with high precision and fineness, and grinding of the device region 4 cannot be avoided.

In addition, in this method, a case in which the semiconductor wafer 1 is concentric with the rotation center of the chuck table 503 does not cause a problem. However, in a case in which the semiconductor wafer 1 is not concentric with the rotation center of the chuck table 503, this case often occurring, the semiconductor wafer 1 is eccentric. Due to this, when the entire peripheral reinforcing portion 5a is ground, the grinding stones 505 overlap with a portion of the device region 4, so that this portion cannot be used, and the yield of the semiconductor chips is decreased. As shown in FIG. 12, when the center of the semiconductor wafer 1 rotating eccentrically is the most remote from the grinding stones 505 as shown by a broken line, the only peripheral reinforcing portion 5a is ground by the grinding stones 505. However, when the center of the semiconductor wafer 1 rotating eccentrically is proximate to the grinding stones 505 as shown by a two-dot chain line, the grinding stones 505 overlap with the device region 4, and the device region 4 is ground by the grinding stones 505.

SUMMARY OF THE INVENTION

Therefore, an object of the present invention is to provide a processing method for a wafer, which can reliably obtain a device region of the wafer as large as possible by precisely removing only peripheral reinforcing portion of the wafer and thereby does not decrease yield of semiconductor chips when the peripheral reinforcing portion is processed around the device region so that the wafer has a plate shape.

According to one aspect of the present invention, a processing method for a wafer includes: preparing a wafer which has a device region having plural devices formed on a surface of the wafer; and a peripheral reinforcing portion which is integrally formed around the device region and has a projection projecting outwardly on a rear surface of the wafer. The processing method further includes: holding the wafer on a holding surface of a rotatable holding table such that the rear surface of the wafer is exposed and the surface of the wafer closely contacts the holding table. The processing method further includes: thinning the peripheral reinforcing portion by cutting and removing at least the projection of the peripheral reinforcing portion of the wafer by using a cutting tool having a rotational shaft parallel to the holding surface, while rotating the wafer by rotating the holding table after the holding of the wafer. The peripheral reinforcing portion is thinned so as to have a thickness equal to or thinner than that of the device region by the thinning.

In the processing method of the present invention, the cutting tool having the rotational shaft parallel to the holding surface is appropriately moved in a predetermined direction parallel to the holding surface and in a direction perpendicular to the predetermined direction, and the cutting tool cuts the projection of the peripheral reinforcing portion, so that the projection is removed and the rear surface of the wafer has a plate shape. In the processing method, since the rotational shaft of the cutting tool is parallel to the holding surface of the holding table, the cutting point of the cutting tool corresponds to a position of the rotational shaft at which the cutting tool is mounted. Therefore, since the cutting position of the cutting tool with respect to the projection is easily controlled, the peripheral reinforcing portion can be reliably removed. As a result, the device region can be secured as large as possible.

Examples of devices and actions for cutting the peripheral reinforcing portion of the wafer by the cutting tool can be used as follows. In one method example, the cutting tool has a width equal to or wider than that of the projection, and the cutting tool is pressed toward a top end surface of the projection of the rotating wafer in a thickness direction of the wafer, and the cutting tool cuts the projection. In this method, the projection is removed by one movement of the cutting tool which presses the entire width of the top end surface of the projection in a thickness direction of the projection. In another method example, entry amount of the cutting tool with respect to the wafer in a thickness direction of the wafer is set such that an edge of the cutting tool corresponds to the rear surface of the device region, and the cutting tool faces the projection and moves parallel to the holding surface toward a side of the projection. In this method, the projection is removed by one movement of the cutting tool which presses the side of the projection so as to cut the projection.

In another method example, the cutting tool moves relatively to the wafer parallel to the holding surface, so that the cutting tool cuts and removes at least the projection. In this method, in particular, the cutting tool may move parallel to an axial direction of the rotational shaft. In the relative movement, at least one of the cutting tool and the holding table may move parallel to the holding surface. In this case, while the wafer may be reciprocated, the cutting tool may be pressed on the top end surface of the projection, thereby cutting the projection. As a result, the projection can be removed efficiently.

In the wafer of which the projection of the peripheral reinforcing portion will be removed in the above processing method of the present invention, the rigidity can be secured by the peripheral reinforcing portion, so that the handleability and the durability can be improved. Therefore, since heat due to deposition, sputtering, or the like cause no problem, a metal film may be provided to a region of the rear surface which corresponds to the device region.

In the present invention, the processing is performed by using the cutting tool having the rotational shaft parallel to the holding surface such that at least the projection of the peripheral reinforcing portion is cut and removed and the peripheral reinforcing portion is thinned so as to have a thickness equal to or thinner than that of the device region. Therefore, only the peripheral reinforcing portion can be reliably removed, so that the device region can be secured as large as possible. As a result, the wafer can be processed to have a plate shape without decreasing the yield of semiconductor chips.

BRIEF DESCRIPTION OF THE DRAWINGS

FIGS. 6A and 6B are a plan view and a cross sectional view which show a dicing tape and a dicing frame.

FIGS. 7A to 7H are side views which show an action example of the cutting blade in turn, the cutting blade cutting a peripheral reinforcing portion of the wafer.

DETAILED DESCRIPTION OF THE INVENTION

An embodiment of the present invention will be explained hereinafter with reference to the drawings.

1. Semiconductor Wafer

Figure 1A:
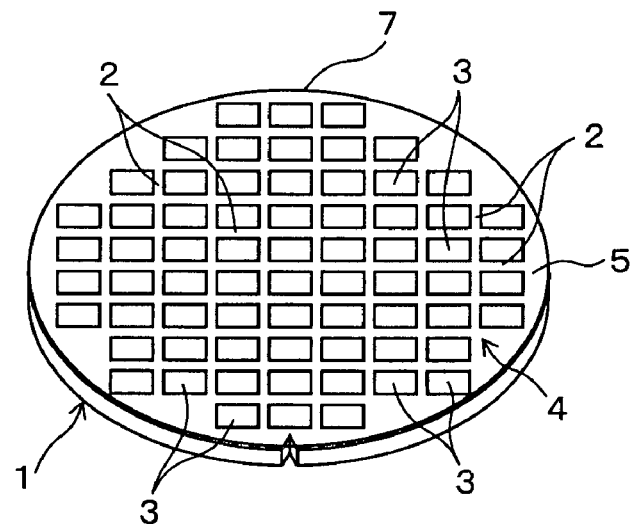
FIGS. 1A to 1C are a surface side perspective view, a rear surface side perspective view, and a cross sectional view which show a wafer processed in an embodiment according to the present invention.
Figure 1B:
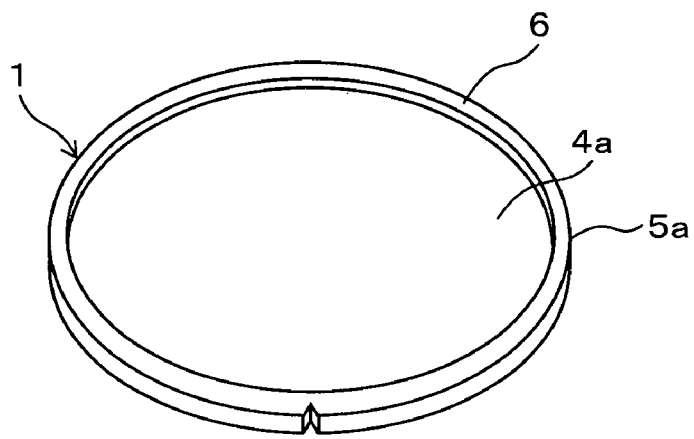
Figure 1C:
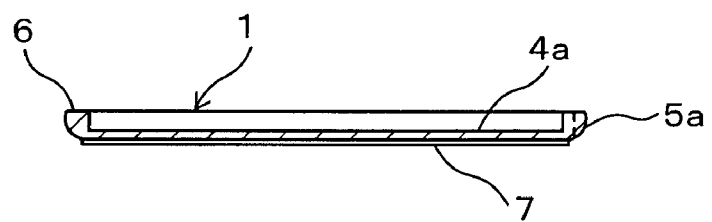

In FIGS. 1A to 1C, reference numeral 1 denotes a disc-shaped semiconductor wafer (hereinafter referred to simply as "wafer") which is processed in the embodiment. The wafer 1 is a silicon wafer or the like. As shown in FIG. 1A, grid-like predetermined division lines 2 are formed on a surface of the wafer 1, and plural rectangular semiconductor chips 3 are defined by the predetermined division lines 2 on the surface of the wafer 1. Electronic circuits (for example, Integrated Circuits (ICs) and Large Scale Integrations (LSIs)), which are not shown in FIGS. 1A to 1C, are formed on surfaces of the semiconductor chips 3. The plural semiconductor chips 3 are formed on a device region 4 which is almost circular so as to be concentric with the wafer 1. A ring-shaped peripheral extra region 5, which has no semiconductor chip 3 formed thereon, is formed around the device region 4.

FIGS. 1B and 1C are views in which a rear surface of the wafer 1 faces upward. As shown in FIGS. 1B and 1C, the rear surface of the wafer 1 has a ring-shaped peripheral edge portion (hereinafter referred to simply as "ring-shaped projection 6") which projects outwardly thereon. A recess 4a is formed inside the ring-shaped projection 6. A portion of the rear surface which corresponds to the device region 4 is ground and removed by a grinding stone or the like, so that the recess 4a is formed. The peripheral extra region 5 is not ground and remains as it is, and it is thereby used as a peripheral reinforcing portion 5a. The peripheral reinforcing portion 5a has the ring-shaped projection 6 projecting on the rear surface of the wafer 1. For example, in the wafer 1, the peripheral reinforcing portion 5a has a thickness of about 600 μm. For example, the device region 4 which is thinned by formation of the recess 4a has a thickness of about 50 to 100 μm.

The wafer 1 may have a metal film on a region of the rear surface corresponding to the device region 4, that is, a bottom of the recess 4a. For example, the metal film is composed of Au and is formed by a method (for example, deposition or sputtering). The wafer 1 may be subjected to a predetermined heating process for ion implantation from the rear surface of the wafer 1. As shown in FIGS. 1A to 1C, a protective tape 7 for protecting the electronic circuits of the semiconductor chips is applied on the surface of the wafer 1. Next, this wafer 1 is transferred to the following processing.

2. Wafer Processing Apparatus

Figure 2:
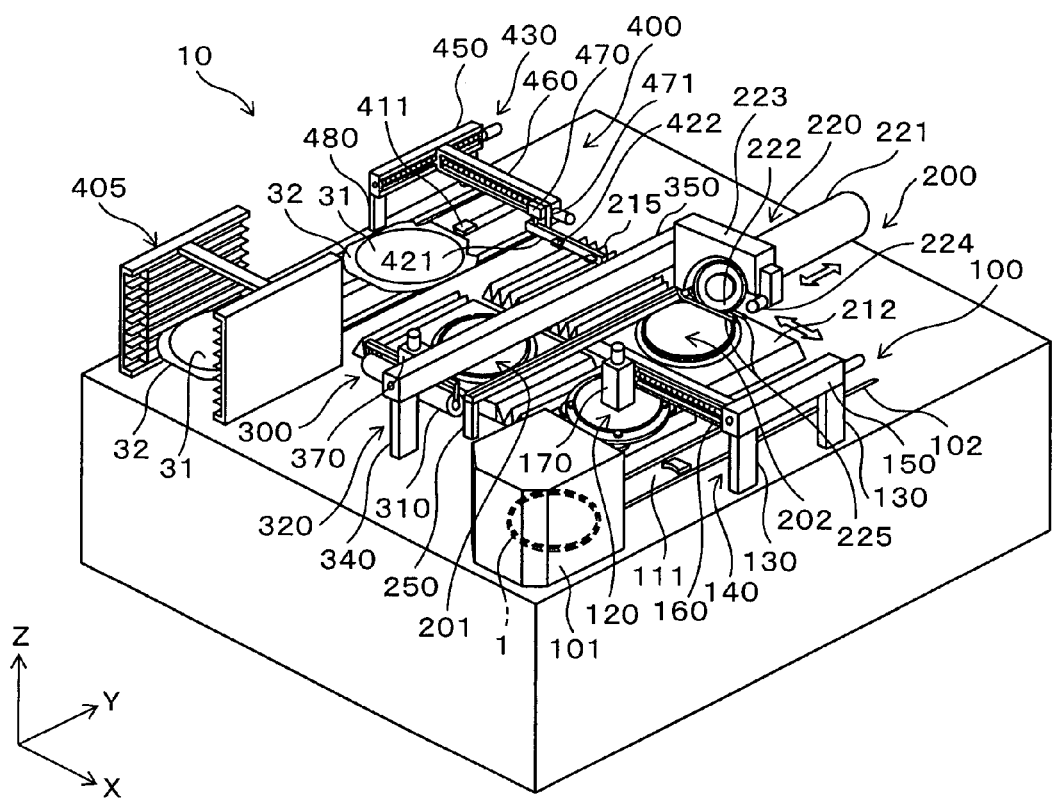
FIG. 2 is an overall perspective view of a wafer processing apparatus of the embodiment according to the present invention.
Figure 3:
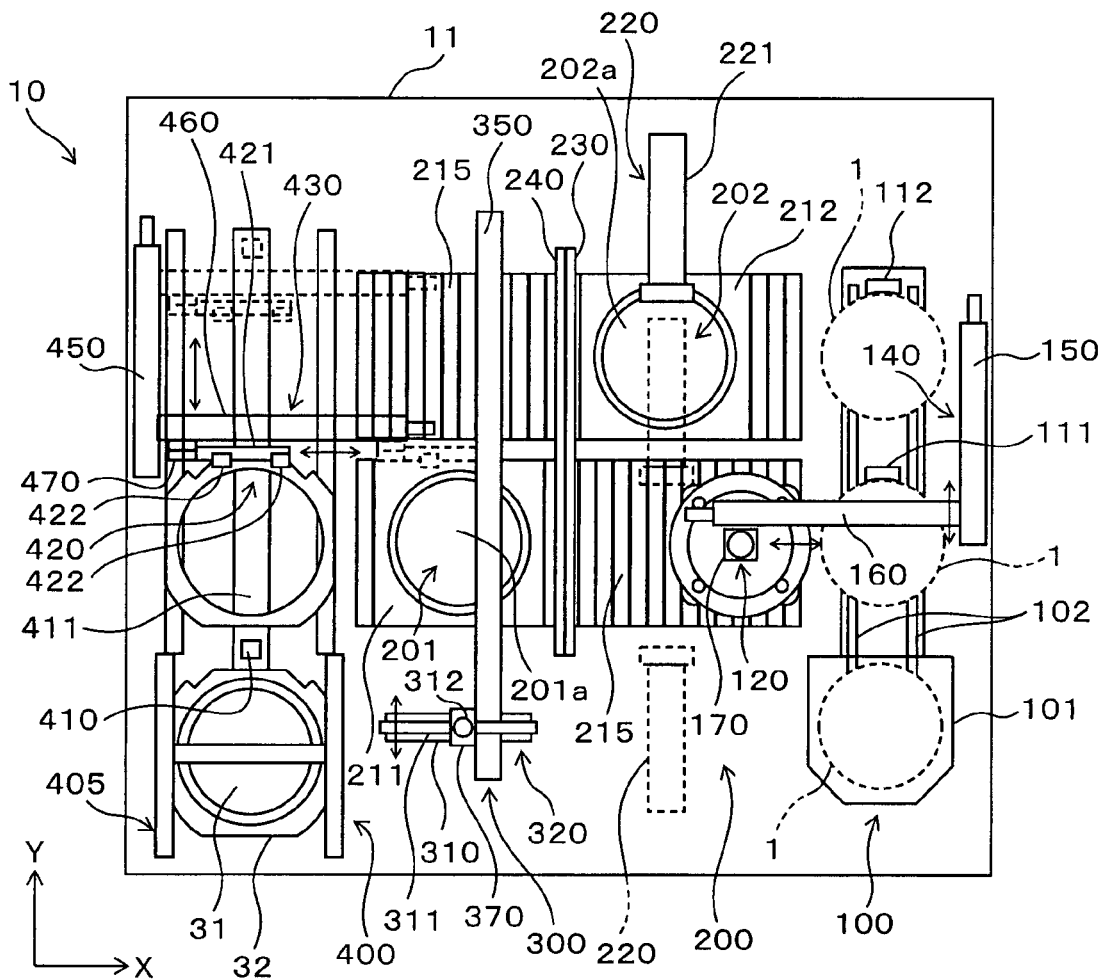
FIG. 3 is a plan view of the wafer processing apparatus shown in FIG. 2.

A wafer processing apparatus, which is desirably used for a processing method of the present invention, will be explained hereinafter with reference to FIGS. 2 to 8C. FIGS. 2 and 3 are a perspective view and a plan view which show a processing apparatus 10. The processing apparatus 10 is equipped with a pedestal 11. From the right side to the left side in the X direction on the pedestal 11 shown in FIG. 3, a wafer supply section 100, a wafer cutting section 200, a dicing tape applying section (holding tape applying device) 300, and a dicing tape carrying section 400 are provided in turn. These sections will be explained hereinafter.

2-a. Wafer Supply Section

The wafer supply section 100 is equipped with a wafer carrier 101, a pair of carrying belts 102, a first stopper 111, a second stopper 112, a wafer hand 120, and a wafer hand driving mechanism 140. The wafer carrier 101 is disposed at one end side (lower end side in FIG. 3) of the Y direction on the pedestal 11. The carrying belts 102 extend from the wafer carrier 101 to the other side of the Y direction. The first stopper 111 and the second stopper 112 are provided at a middle portion and a downstream portion (upper end portion in FIG. 3) of the carrying belts 102 between the carrying belts 102. The wafer hand 120 picks up a wafer 1 and carries it to the wafer cutting section 200. The wafer hand driving mechanism 140 moves the wafer hand 120 in the X, Y and Z directions.

Plural wafers 1 are provided in the wafer carrier 101 so as to be stored horizontally such that rear surfaces of the wafers 1 face upward. The wafer carrier 101 has an elevating mechanism therein. The wafer carrier 101 moves wafers 1, which are provided therein, vertically by one step by using the elevating mechanism. The wafer 1 moved to the lowest step by the elevating mechanism is mounted on the carrying belts 102, and it is moved by the carrying belts 102 toward the stoppers 111 and 112. The first stopper 111 is a vertical moving type stopper or a retractable type stopper so as to stop at a stopper position and a non-stop position. At the stopper position of the first stopper 111, the wafer 1 carried by the carrying belts 102 abuts to the first stopper 111. From the stopper position to the non-stop position, the first stopper 111 moves downwardly so that the wafer 1 passes therethrough. The second stopper 112 is securing type stopper for stopping the wafer 1.

Figure 4:
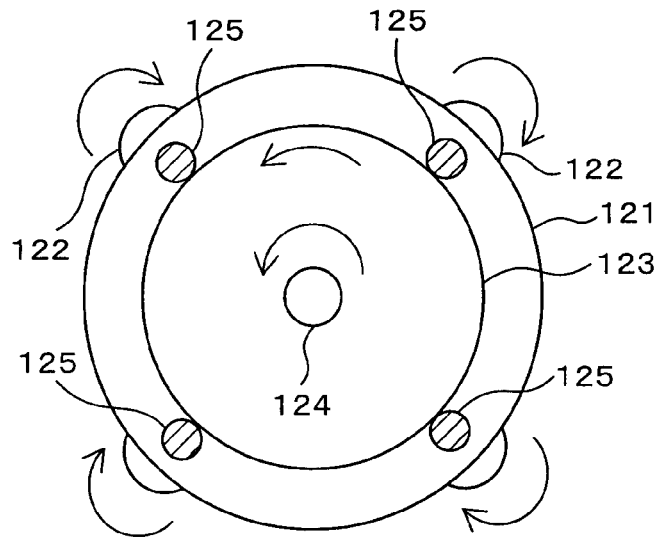
FIG. 4 is a plan view which shows a wafer hand of wafer supply section of the wafer processing apparatus.
Figure 5A:
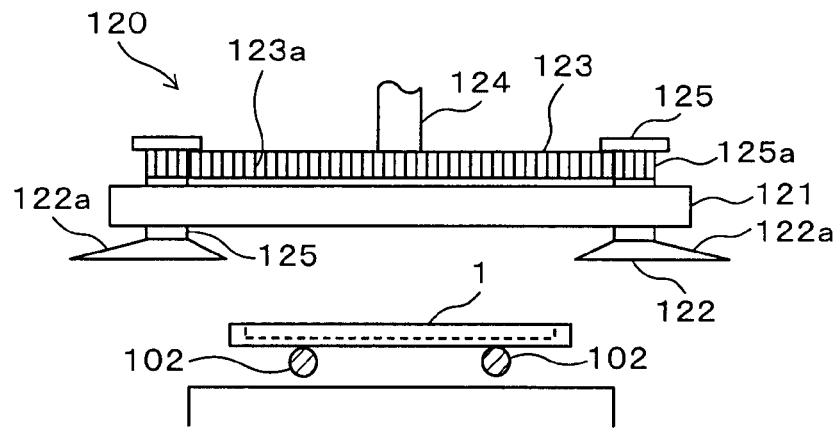
FIGS. 5A to 5D are side views which show actions of the wafer hand in turn.
Figure 5B:
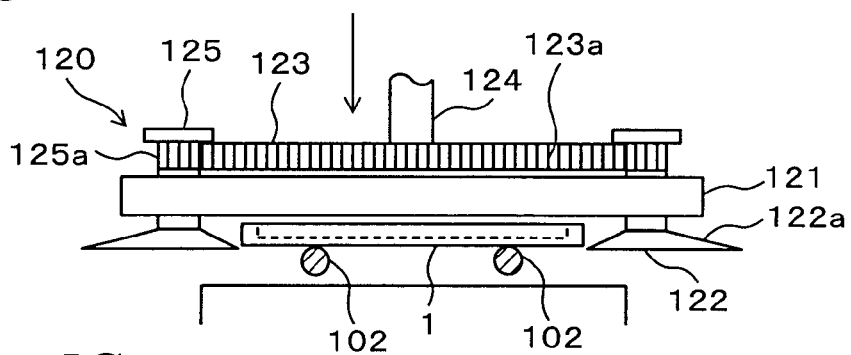
Figure 5C:
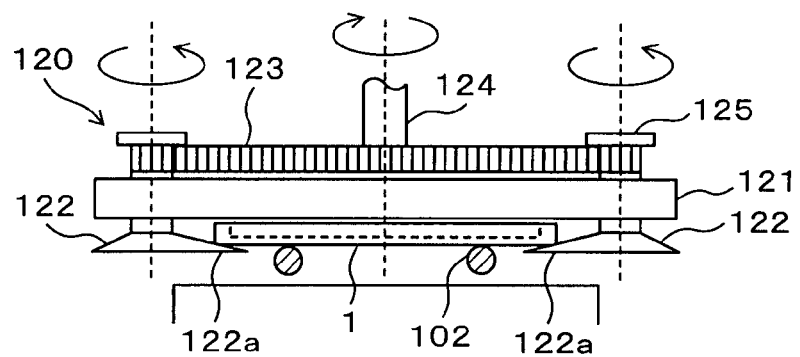
Figure 5D:
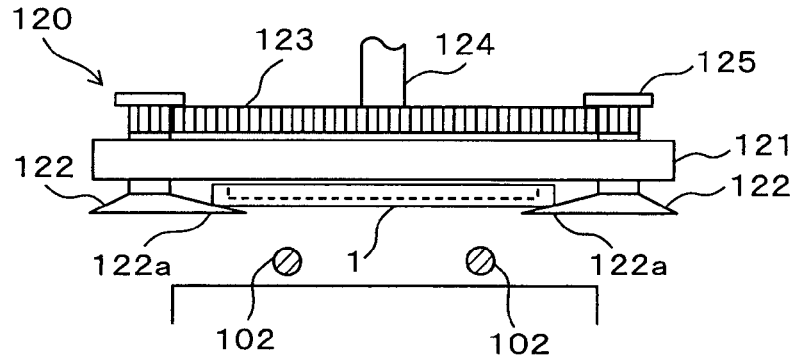

As shown in FIGS. 4 to 5D, the wafer hand 120 is equipped with a disc-shaped base 121, plural hand picks 122, a disc-shaped gear plate 123, and a hand shaft 124. The hand picks 122 are provided on the base 121. The gear plate 123 is disposed above the base 121. The hand shaft 124 is secured at the center of the gear plate 123 and extends upward. Plural (in the embodiment, four) pick shafts 125 which extend in the Z direction (vertical direction) are provided at a circumferential portion of the base 121 so as to be equally spaced from each other. The pick shafts 125 penetrate the circumferential portion so as to be rotatable and so as not to be movable in the axial direction. The hand picks 122 are provided at end portions of the pick shafts 125 which project downwardly from the base 121. The hand picks 122 are relatively flat conical so as to broaden outwardly in the lower direction.

On the other hand, gear portions 125a are formed at end portions of the pick shafts 125 which project upwardly from the base 121. Gear portions 123a, which are formed on a peripheral surface of the gear plate 123, mesh with the gear portions 125a of the pick shafts 125. The gear plate 123 and the pick shafts 125 are concentric with the hand shaft 124. When the gear plate 123 rotates together with the hand shaft 124 in one direction, the rotation thereof is transmitted to each pick shaft 125 via the gear portions 123a and 125a, and the hand pick 122 rotates in cooperation therewith.

Each hand pick 122 has a teardrop shape in plan view. The hand picks 122 are provided on the pick shafts 125 such that leading end portions 122a of all hand picks 122, which are sharply angled, face the rotational axis of the hand shaft 124 when they are positioned at a predetermined rotation angle. When the leading end portions 122a of all hand picks 122 face the rotational axis of the hand shaft 124 in the above manner, as shown in FIG. 5C, the wafer 1 can be received on the leading end portions 122a of the hand picks 122. As shown in FIG. 5B, when the hand picks 122 are rotated by about 180 degrees from the above pick-up positions, the wafer 1 cannot be received on the hand picks 122, so that the wafer 1 can pass through the inside of each hand pick 122.

As shown in FIGS. 2 and 3, the hand shaft 124 of the wafer hand 120 is rotatably and elevatably supported by a Z axis driving mechanism 170 of the wafer hand driving mechanism 140. In the Z axis driving mechanism 170, a driving mechanism for rotating and vertically elevating of the hand shaft 124 is provided. The wafer hand driving mechanism 140 has a Y axis driving mechanism 150, an X axis driving mechanism 160, and the Z axis driving mechanism 170. The Y axis driving mechanism 150 is provided proximate to the carrying belts 102 on the pedestal 11 via a column 130, and it extends in the Y direction. The X axis driving mechanism 160 is provided so as to engage with the Y axis driving mechanism 150 and cross above the carrying belts 102 in the X direction. The Z axis driving mechanism 170 engages with the X axis driving mechanism 160 and extends in the Z direction.

The Y axis driving mechanism 150 and the X axis driving mechanism 160 are screw rod type driving mechanisms. The Y axis driving mechanism 150 moves the X axis driving mechanism 160 in the Y direction. The X axis driving mechanism 160 moves the Z axis driving mechanism 170 in the X direction. The wafer hand 120 is moved in the X, Y and Z directions by the Y axis driving mechanism 150, the X axis driving mechanism 160, and the Z axis driving mechanism 170. Next, the wafer hand 120 picks up the wafer 1 which is stopped by the first stopper 111 or the second stopper 112, and it moves the wafer 1 to the wafer cutting section 200.

2-b. Wafer Cutting Section

The wafer cutting section 200 is equipped with a first chuck table 201, a second chuck table 202, and a cutting unit 220. The first chuck table 201 and the second chuck table 202 are provided proximate to wafers 1 stopped by the stoppers 111 and 112. The cutting unit 220 moves so as to cross above the chuck tables 201 and 202 in the Y direction. The chuck tables 201 and 202 are typical vacuum chuck type tables. The chuck tables 201 and 202 have holding surfaces 201a and 202a which are flat upper surfaces for chucking and holding the wafers 1. The chuck tables 201 and 202 are rotated by rotation driving mechanisms (not shown in the drawings) around each center which is a rotational axis. The chuck tables 201 and 202 are rotatably supported by table bases 211 and 212 which reciprocate in the X direction. A cornice-shaped cover 215 is stretchably provided on both sides of the moving direction of each table base 211 and 212 so as to cover the moving path of each table base 211 and 212 in order to prevent intrusion of cut waste or the like thereinto.

Each chuck table 201 and 202 reciprocates together with the table bases 211 and 212 from the neighborhood of the wafer supply section 100 to the dicing tape applying section 300 in the X direction. The wafer 1 is carried onto the chuck table 201 (202) by the wafer hand 120 such that the rear surface of the wafer 1, on which the ring-shaped projection 6 of the peripheral reinforcing portion 5a projects, faces upward. Next, while the wafer 1 is held on the chuck table 201 (202), the peripheral reinforcing portion 5a including the ring-shaped projection 6 is cut and removed by the cutting unit 220.

The cutting unit 220 is equipped with a cylindrical spindle housing 221 and a cutting blade 222. The spindle housing 221 has an axial direction parallel to the Y direction. The cutting blade 222 is provided on a spindle which is a rotation driving shaft provided in the spindle housing 221. The spindle housing 221 is supported by a frame (not shown in the drawings) provided on the pedestal 11 so as to reciprocate in the Y direction and move vertically in the Z direction while the axial direction of the spindle housing 221 is parallel to the Y direction. A driving mechanism (not shown in the drawings) for moving the cutting unit 220 in these directions is provided on the frame. The cutting blade 222 has an axial direction parallel to the Y direction. That is, the axial direction of the cutting blade 222 is parallel to the holding surfaces 201a and 202a of the chuck tables 201 and 202.

As shown in FIG. 2, a blade cover 223 is provided at an end portion (lower end portion in FIG. 3) of the spindle housing 221 which is proximate to the cutting blade 222. Cutting water nozzles 224 and 225 are provided on the blade cover 223, and they supply cutting water onto processed points of the wafer 1. The cutting water is used for lubricating, cooling, cleaning, and the like during the cutting. The cutting unit 220 is provided so as to cross above the chuck tables 201 and 202 in the Y direction, so that cutting unit 220 can cut the wafer 1 held on the first chuck table 201 and the second chuck table 202.

2-c. Dicing Tape Carrying Section

The movable ranges of the chuck tables 211 and 212 in the X direction are about 2 to 3 times as long as the lengths (widths) of the chuck tables 211 and 212. An area which extends from a middle point of the movable range and is proximate to the wafer supply section 100 is set as an area of the wafer cutting section 200. An area which extends from the middle point of the movable range and is proximate to the dicing tape carrying section 400 is set as an area of the dicing tape applying section 300. A cleaning water shower nozzle 230 and an air nozzle 240 are arranged next to each other at a boundary portion between the wafer cutting section 200 and the dicing tape applying section 300. The cleaning water shower nozzle 230 sprays cleaning water onto the wafer 1 disposed on the chuck table 201. The air nozzle 240 blows high pressure air onto the wafer 1 on which the cleaning water is sprayed, thereby removing the water therefrom. The nozzles 230 and 240 are long tubular nozzles which extend in the Y direction, and they have plural spraying openings which are dotted in the longitudinal direction thereof and face downward. The cleaning water shower nozzle 230 is disposed on the side of the wafer cutting section 200, and the air nozzle 240 is disposed on the side of the dicing tape applying section 300. The nozzles 230 and 240 are provided so as to cross above the moving paths of the table bases 211 and 212 via a column 250 which stands on the pedestal 11.

The dicing tape applying section 300 is equipped with a pressing roller 310 and a roller driving mechanism 320. The pressing roller 310 presses and applies the dicing tape 31, which is shown in FIGS. 6A and 6B, on the wafer 1. The roller driving mechanism 320 moves the pressing roller 310 in the Y and Z directions. The pressing roller 310 has a surface composed of elastic body (for example, rubber) which is appropriately elastic. The pressing roller 310 is rotatably supported by an X direction rotation shaft of roller frame 311. The roller frame 311 is elevatably supported by a Z axis driving mechanism 370 of the roller driving mechanism 320 via a shaft 312 which extends in the Z direction. The Z axis driving mechanism 370 has an elevating mechanism therein. The elevating mechanism elevates the shaft 312 and the pressing roller 310.

The roller driving mechanism 320 is equipped with a Y axis driving mechanism 350 and the Z axis driving mechanism 370. The Y axis driving mechanism 350 is supported by a column 340 which stands on the pedestal 11. In this case, the Y axis driving mechanism 350 is provided so as to cross above the moving paths of the table bases 211 and 212 in the Y direction. The Z axis driving mechanism 370 is provided proximate to the dicing tape carrying section 400 of the Y axis driving mechanism 350. The Z axis driving mechanism 370 engages with the Y axis driving mechanism 350 and extends in the Z direction. The Y axis driving mechanism 350 is a screw rod type driving mechanism and moves the Z axis driving mechanism 370 in the Y direction. The pressing roller 310 is reciprocated on the moving paths of the table bases 211 and 212 by the Y axis driving mechanism 350. The pressing roller 310 is elevated by the Z axis driving mechanism 270.

2-d. Dicing Tape Carrying Section

The dicing tape carrying section 400 carries the dicing tape 31, which is shown in FIGS. 6A and 6B, to the dicing tape applying section 300. For example, the dicing tape 31 is an adhesive tape which has a base film and an adhesive coated on a surface of the base film. For example, the base film of the dicing tape 31 is composed of polyvinylchloride and has a thickness of about 100 µm. The adhesive is composed of acrylic resin and has a thickness of about 5 µm. A ring-shaped dicing frame 32 is applied to the adhesive surface of the dicing tape 31. The dicing frame 32 has an inner diameter larger than the diameter of the wafer 1. The dicing frame 32 is composed of a rigid member (for example, a metal plate). The wafer 1 is applied to the dicing tape 31, and handling (for example, carrying) of the wafer 1 is performed by holding the dicing frame 32.

The dicing tape carrying section 400 is equipped with a cassette 405, a drawing clamp 410, a carrying clamp portion 420, and a clamp driving mechanism 430. The cassette 405 is disposed at an end portion (lower end portion in FIG. 3) of the Y direction on the pedestal 11. The drawing clamp 410 is disposed proximate to the other end portion of the cassette 405 in the Y direction, and draws a dicing frame 32, which has one dicing tape, from the cassette 405. The carrying clamp portion 420 carries the dicing frame 32, which is held by the drawing clamp 410, to the dicing tape applying section 300. The clamp driving mechanism 430 moves the carrying clamp portion 420 in the X, Y and Z directions.

Plural dicing frames 32 which have dicing tapes are stored and provided in the cassette 405 such that adhesive surfaces of the dicing tapes 31 face downward and are disposed horizontally. The clamp driving mechanism 430 is equipped with a Y axis driving mechanism 450, an X axis driving mechanism 460 and a Z axis driving cylinder 470. The Y axis driving mechanism 450 has the same construction as that of the Y axis driving mechanism 150 of the wafer supplying section 100. The X axis driving mechanism 460 has the same construction as that of the X axis driving mechanism 160 of the wafer supplying section 100. The cassette 405 moves the dicing frame 32 vertically by one step by using an elevating mechanism provided therein in the same manner as the wafer carrier 101. The dicing frame 32, which is moved to a predetermined drawing position, is drawn from the cassette 405 by the drawing clamp 410.

The Y axis driving mechanism 450 of the clamp driving mechanism 430 is provided via a column 480 at a side (left side in FIG. 3) which is appropriately away from the cassette 405 in the other side of the Y direction. The disposed position of the Y axis driving mechanism 450 corresponds to a line extending from the direction in which the second chuck table 202 moves toward the dicing tape carrying section 400. The X axis driving mechanism 460 extending to the dicing tape applying section 300 engages with the Y axis driving mechanism 450.

The drawing clamp 410 holds one dicing frame 32 provided in the cassette 405. The drawing clamp 410 is provided in a groove 411 which is formed on the upper surface of the pedestal 11 and extends in the Y direction. The drawing clamp 410 is movable along the groove 411 and is reciprocated between the cassette 405 and the X axis driving mechanism 460 by using a driving mechanism which is not shown in the drawings.

Figure 8A:
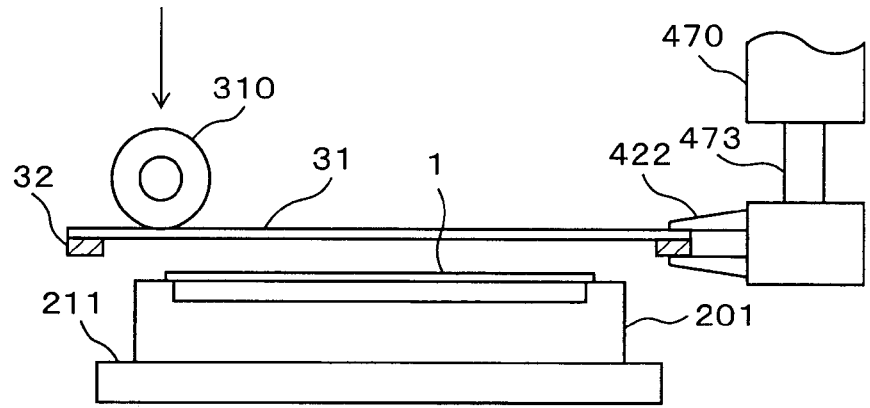
FIGS. 8A to 8C are side views which show a process in turn, in which the dicing tape is applied to the rear surface of the wafer by a pressing roller.
Figure 8B:
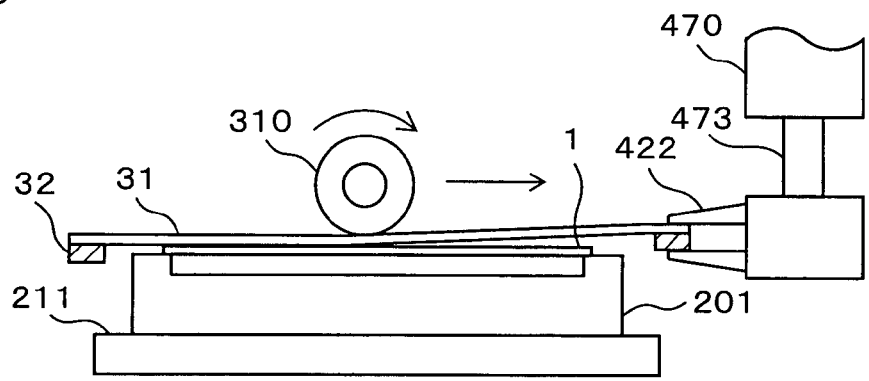
Figure 8C:
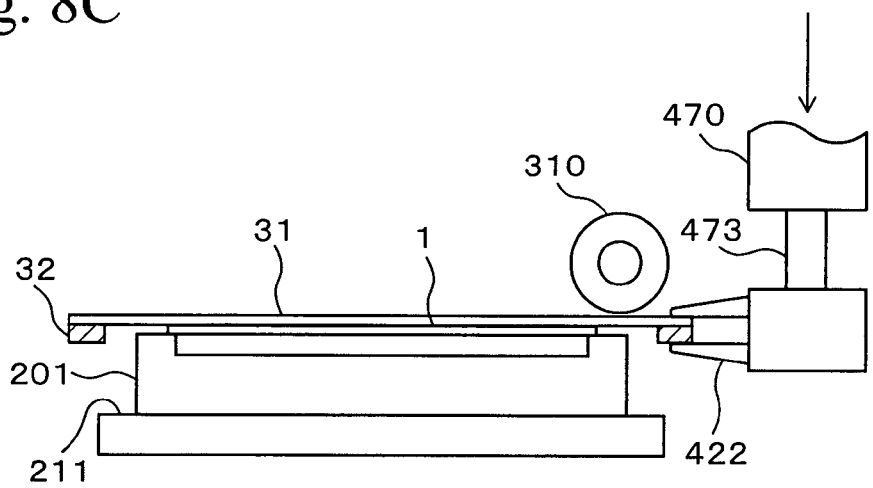
Figure 9:
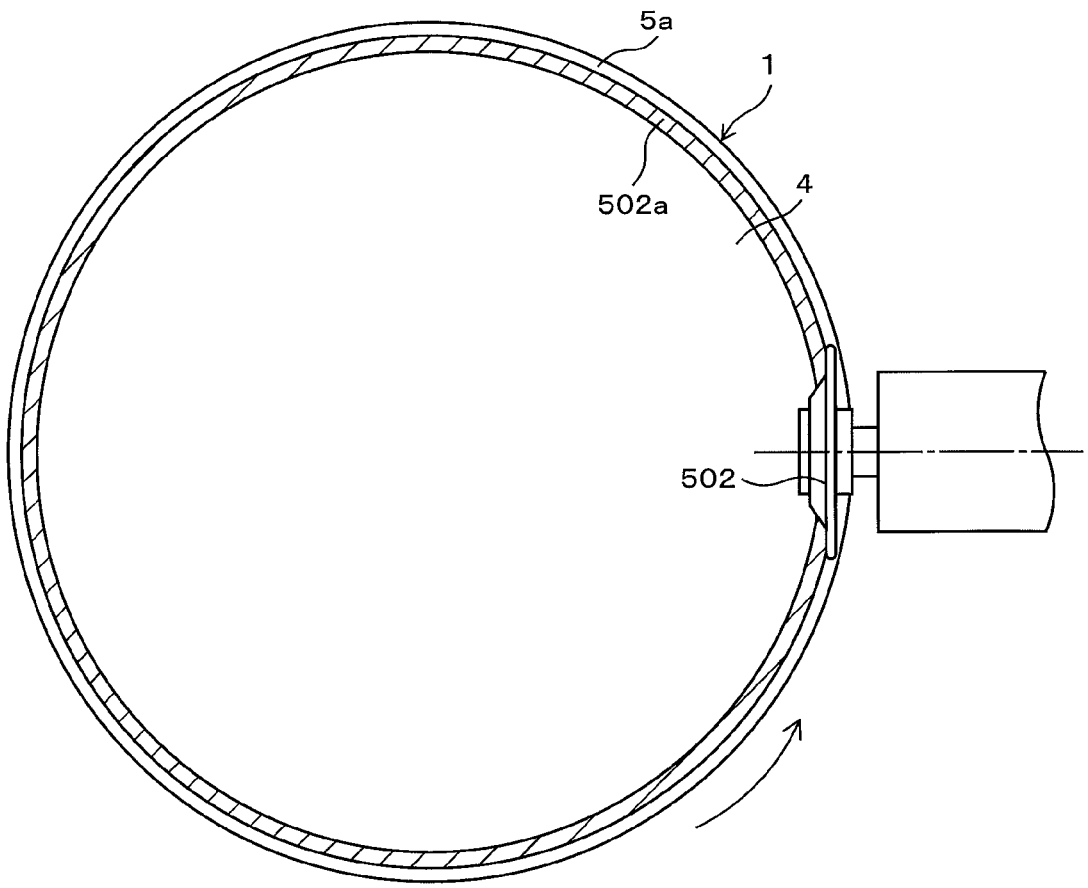
FIG. 9 is one example of conventional method for removing a peripheral reinforcing portion.
Figure 10:
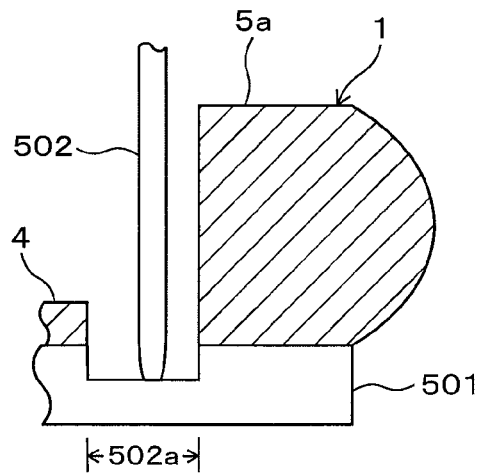
FIG. 10 is a cross sectional view of the method shown in FIG. 9.
Figure 11:
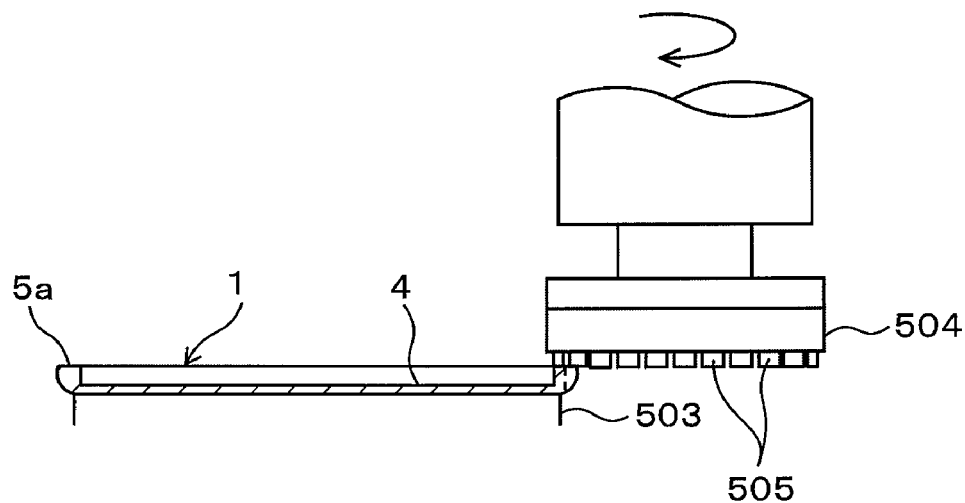
FIG. 11 is another example of conventional method for removing a peripheral reinforcing portion.
Figure 12:
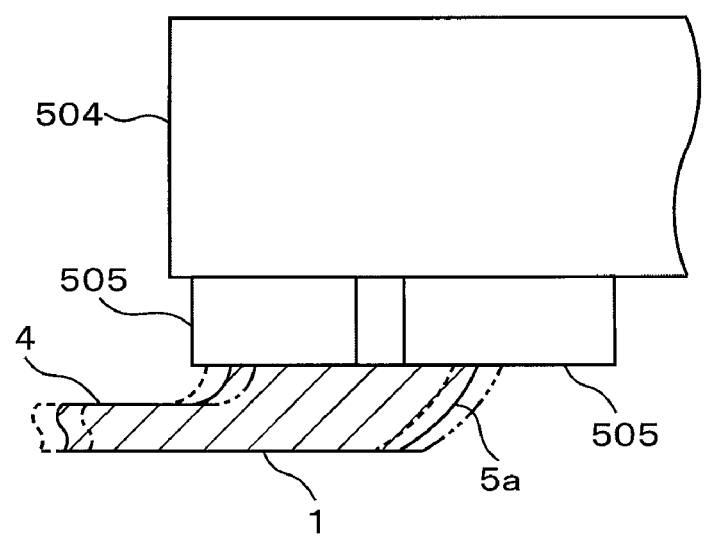
FIG. 12 is an enlarged view of the method shown in FIG. 11.

The Z axis driving cylinder 470 engages with the X axis driving mechanism 460 via a base plate 471. As shown in FIGS. 8A to 8C, the Z axis driving cylinder 470 has a piston 473 which is stretchable downwardly. The carrying clamp portion 420 has a stay 421 and a pair of carrying clamps 422. The stay 421 has an end portion which is secured at a lower end of the piston 473 of the Z axis driving cylinder 470, and the stay 421 extends in the X direction toward the dicing tape applying section 300. The carrying clamps 422 are provided on a surface of the stay 421, which faces the cassette 405, so as to be spaced a predetermined distance from each other in the X direction. The carrying clamp 422 holds the dicing frame 32 in the same manner as the drawing clamp 410.

In the clamp driving mechanism 430, the Y axis driving cylinder 450 moves the X axis driving mechanism 460 in the Y direction, and the X axis driving mechanism 460 moves the Z axis driving cylinder 470 in the X direction. Therefore, the carrying clamp portion 420 is moved together with the X axis driving mechanism 460 in the Y direction, and is moved together with the Z axis driving cylinder 470 in the X direction. The carrying clamp portion 420 is moved vertically (in the Z direction) by the piston 473 of the Z axis driving cylinder 470.

3. Action of Wafer Processing Apparatus

Next, an action example of the above constructed wafer processing apparatus 10 will be explained hereinafter.

One wafer 1 is drawn from the wafer carrier 101 of the wafer supply section 100 by the carrying belts 102. The wafer 1 is carried to the first stopper 111 by the carrying belts 102, and the carrying belts 102 stop. The wafer 1 is abutted to the first stopper 111 and is stopped thereby. In this case, the rear surface of the wafer 1, which has the recess 4a formed thereon, faces upward. Next, the wafer hand 120 picks up the wafer 1.

As shown in FIG. 5A, the wafer hand 120 is moved directly above the wafer 1 by the wafer hand driving mechanism 140 in the condition that the leading end portion 122a of the hand pick 122 faces outwardly. As shown in FIG. 5B, the wafer hand 120 is moved downwardly by the Z axis driving mechanism 170, so that the lower surface of the hand pick 122 is positioned lower than the lower surface of the wafer 1. Next, the gear plate 123 is rotated by rotating of the hand shaft 124, in cooperation with the gear plate 123, and the hand pick 122 is rotated together with each pick shaft 125 by about 180 degrees. As shown in FIG. 5C, the leading end portion 122a of the hand pick 122 moves under the lower surface of the wafer 1. While this condition shown in FIG. 5C is maintained, as shown in FIG. 5D, the wafer hand 120 is moved upwardly, so that the wafer 1 is held upwardly. Since a peripheral portion of the surface of the wafer 1, which corresponds to the peripheral reinforcing portion 5a, is received by the hand pick 122, the wafer 1 can be carried without an excessive load being applied on the wafer 1.

Next, the wafer hand 120 is appropriately carried in the X and Y directions by the wafer hand driving mechanism 140 and is moved downwardly, so that the wafer 1 is mounted on the first chuck table 201 of the wafer cutting section 200 which is moved proximate to the wafer supply section 100 beforehand and is under vacuum operation. The wafer 1 is chucked and held on the chuck table 201. The wafer hand 120 is moved upwardly from the wafer 1 and is returned to the front side of the wafer carrier 101 in order to carry a next wafer 1. The wafer 1 is desirably concentric with the rotation center of the first chuck table 201. Alternatively, the center of the wafer 1 may be shifted slightly from the rotation center of the first chuck table 201.

The first chuck table 201 holding the wafer 1 is rotated, and the table base 211 is moved toward the dicing tape applying section 300, so that the rotation center of the first chuck table 201 corresponds to the rotational shaft of the cutting unit 220. The cutting unit 220 is moved in the Y direction and is positioned above the wafer 1. While the cutting blade 222 is rotated at a high speed, the cutting unit 220 is moved downwardly. The cutting blade 222 cuts the ring-shaped projection 6 of the peripheral reinforcing portion 5a of the wafer 1, and it repeatedly reciprocates in the Y direction. As a result, at least the ring-shaped projection 6 of the peripheral reinforcing portion 5a is cut and removed. For example, the position of the cutting blade 220 in the Y direction is a position at which the cutting blade 220 cuts the other end portion (upper portion in FIG. 3) of the Y direction on the peripheral reinforcing portion 5a.

FIGS. 7A to 7H show an action example of the cutting blade 222 which cuts the peripheral reinforcing portion 5a. In this case, the cutting blade 222 has an edge thickness which is almost half of the width of the peripheral reinforcing portion 5a.

As shown in FIGS. 7A and 7B, first, the cutting blade 222 moves from the upside, and it cuts an inner circumferential side of the ring-shaped projection 6 of the peripheral reinforcing region 5a. As shown in FIG. 7C, the cutting blade 222 moves to an outer circumferential side of the ring-shaped projection 6 along the rotational shaft of the cutting blade 222, so that the height of the ring-shaped projection 6 is reduced by one step. Next, as shown in FIG. 7D, the cutting blade 222 moves downwardly, so that the cutting blade 222 cuts the outer circumferential side of the ring-shaped projection 6. As shown in FIG. 7E, the cutting blade 222 moves to the inner circumferential side of the ring-shaped projection 6, so that the height of the ring-shaped projection 6 is further reduced by one step. Next, as shown in FIG. 7F, the cutting blade 222 moves downwardly, and it cuts the inner circumferential side of the ring-shaped projection 6 slightly more deeply than the device region 4. As shown in FIG. 7G, the cutting blade 222 moves to the outer circumferential side of the ring-shaped projection 6, the height of the ring-shaped projection 6 is further reduced by one step, and the cutting blade 222 moves away from the wafer 1. As shown in FIG. 7H, the wafer 1 is obtained such that the peripheral reinforcing region 5a is thinner than the device region 4. The whole horizontal reciprocation direction of the cutting blade 222 extends along the rotational shaft of the cutting blade 222, and the cutting direction of the cutting blade 222 is the Z direction (vertical direction). In the cutting of the wafer 1, the appropriate amount of the cutting water is supplied from the cutting water nozzles 224 and 225 onto the processed points of the wafer 1.

In the above manner, after the reinforcing region 5a is processed by the wafer cutting section 200, the table base 211 is moved, so that the processed wafer 1 is disposed on the dicing tape applying section 300. In the moving of the table base 211, the cleaning water is sprayed from the cleaning water shower nozzle 230 onto the wafer 1, so that ground waste and the like are cleaned. The high pressure air is blown from the air nozzle 240, so that the water clinging on the wafer 1 is removed.

When the peripheral reinforcing portion 5a of the wafer 1 is processed by the wafer cutting section 200 and the processed wafer 1 is carried to the dicing tape applying section 300, in the dicing tape carrying section 400, one dicing frame 32 having the dicing tape 31 provided thereon is drawn from the cassette 405, and the dicing frame 32 is carried to the dicing tape applying section 300.

In the above action in the dicing tape carrying section 400, first, the drawing clamp 410 holds one dicing frame 32 provided in the cassette 405, it moves toward the X axis driving mechanism 460, and it draws the dicing frame 32. Next, the drawing clamp 410 moves the dicing frame 32 proximate to the first chuck table 201 disposed on the dicing tape applying section 300 as shown in FIG. 3. The carrying clamp portion 420 is disposed proximate to the other end side (upper end side in FIG. 3) of the Y direction on the drawn dicing frame 32, and the piston 473 is moved downwardly. The carrying clamp 422 holds the dicing frame 32, and the holding of the dicing frame 32 by the drawing clamp 410 is stopped, so that the dicing frame 32 is received to the carrying clamp 422. Next, the dicing frame 32 is held upwardly by moving the piston 473 upwardly, and the carrying clamp portion 420 is moved to the dicing tape applying section 300. Therefore, the dicing tape 31, which is provided on the dicing frame 32 held by the carrying clamp 422, is moved directly above the wafer 1 disposed on the dicing tape applying section 300. The dicing tape 31 is desirably disposed proximate to the wafer 1 so as to be spaced about several millimeters therefrom.

Next, the dicing tape 31 is applied on the rear surface of the wafer 1 by the pressing roller 310. As shown in FIG. 3, the pressing roller 310 is waiting in advance at the end portion side (lower side in FIG. 3) of the Y axis driving mechanism 350 in the Y direction. First, the pressing roller 310 is moved onto the dicing tape 31 by the Y axis driving mechanism 350. Next, as shown in FIG. 8A, after the pressing roller 310 is moved downwardly so as to abut to the surface of the dicing tape 31 by the Z axis driving mechanism 370, the pressing roller 310 is further moved downwardly, so that the end portion of the dicing tape 31 is pressed on the rear surface of the wafer 1 by the pressing roller 310. Next, as shown in FIGS. 8B to 8C, while the pressing roller 310 presses the dicing tape 31, the pressing roller 310 rolls toward the carrying clamp 422. As a result, the dicing tape 31 is pressed on the rear surface of the wafer 1, thereby being applied thereon. In this manner, the pressing roller 310 moves from one end side to the other end side on the rear surface of the wafer 1, and the dicing tape 31 is pressed thereon by the pressing roller 310, so that the dicing tape 31 can be applied without the air entering between the wafer 1 and the dicing tape 31.

In the final stage of the above applying, an end portion of the dicing tape 31 is not applied on the wafer 1 due to a vertical gap between the dicing frame 32 and the wafer 1, thereby being rolled up. Due to this, it is difficult to apply the end portion of the dicing tape 31 on the wafer 1 smoothly. In order to solve this difficulty, for example, the Z axis driving cylinder 470 is elastically supported with respect to the base plate 471 so as to be movable vertically by using a cushion spring, so that the carrying clamp 422 moves downwardly in accordance with the dicing tape 31. Thus, the adhesion of the dicing tape 31 can be improved, so that the above technique is desirable.

In the above manner, the wafer 1 is processed such that the peripheral reinforcing portion 5a is thinner than the device region 4, and the dicing tape 31 is applied onto the rear surface of the wafer 1. Next, the dicing tape carrying section 400 operates in reverse of the above operation, so that the above wafer 1 is provided into the cassette 405. Finally, the wafer 1 applied on the dicing tape 31 is cut along the predetermined division lines 2 by a cutting apparatus or the like, thereby being divided into plural semiconductor chips 3. The above cutting and removing of the peripheral reinforcing portion 5a by the wafer cutting section 200 is performed in order that the ring-shaped projection 6 on the rear surface of the wafer 1 is removed and the rear surface becomes flat and can be held by a typical chuck table when the wafer 1 is divided into plural semiconductor chips 3.

In the wafer cutting section 200 of the wafer processing apparatus 10, while the cutting blade 222 reciprocates parallel to the rotational shaft of the cutting blade 222, the cutting blade 222 cuts the ring-shaped projection 6 of peripheral reinforcing portion 5a of the wafer 1. As a result, the ring-shaped projection 6 is cut off and removed. In this method, the axial movement of the cutting blade 222 (in practice, the cutting unit 220) is appropriately controlled so that the cutting blade 222 does not enter the device region 4. Therefore, only the peripheral reinforcing portion 5a can be reliably removed, and the device region 4 can be secured as large as possible. As a result, the rear surface of the wafer 1 can be processed to be flat for applying the dicing tape 31 thereon without decreasing the yield of the semiconductor chips 3.

If the wafer 1 is held such that the center of the wafer 1 corresponds to that of the chuck table 201 and the wafer 1 is concentric with the chuck table 201, the reciprocation of the cutting blade 222 has an amplitude which simply corresponds to the width of the peripheral reinforcing portion 5a. If the wafer 1 is held to be eccentric with the chuck table 201, in one rotation of the chuck table 201, the cutting blade 222 may enter the device region 4. This case was one conventional problem. However, this problem can be relatively easily solved by the control method in which the cutting blade 222 reciprocates in the axial direction. This method can be realized as follows. For example, the mounted position of the wafer 1 on the chuck table 201 is recognized by using a microscope for alignment before the processing. The reciprocation of the cutting blade 222 is synchronized with the rotation of the chuck table 201.

In the above embodiment, only the case in which the wafer 1 is cut on the first chuck table 201 is explained above. Alternatively, for example, in the wafer processing apparatus 10, the chuck tables 201 and 202 may be used. In this case, the one of the chuck tables 201 and 202 may be used for the cutting, and the other of the chuck tables 201 and 202 may be used for the applying of the dicing tape 31, so that the operation of the wafer processing apparatus 10 can be efficient. In the above embodiment, the wafer processing apparatus 10 has one cutting unit 220. Alternatively, as shown in FIG. 3, another cutting unit 220 (shown by a broken line) may be provided to face the cutting unit 220. In this case too, the peripheral reinforcing portion 5a may be cut by the axial reciprocation of the another cutting unit 220. In this structure, since one peripheral reinforcing portion 5a of one wafer 1 can be cut by using the two cutting units 220, the processing speed can be greatly reduced.

In the above embodiment, in the wafer cutting section 200, the cutting unit 220 is reciprocated in the axial direction. Alternatively, the chuck table 201 and the table base 211 may be reciprocated in the axial direction of the cutting blade 222, and the wafer 1 may be reciprocated with respect to the cutting blade 222 which is secured, and the peripheral reinforcing portion 5a may be cut. That is, the cutting unit 220 and the chuck table 201 may be relatively moved in the axial direction of the cutting blade 222. In this case, at least one of the cutting unit 220 and the chuck table 201 may be moved.

What is claimed is:

1. A processing method for a wafer, comprising:
preparing a wafer which has a device region having plural devices formed on a surface of the wafer; forming a peripheral reinforcing portion which is integrally formed around the device region on a rear surface of the wafer, and wherein the peripheral reinforcing portion includes a ring-shaped projection extending away from the device region; holding the wafer on a holding surface of a rotatable holding table such that the rear surface of the wafer is exposed and the surface of the wafer closely contacts the holding table; and thinning the ring-shaped projection by cutting and removing at least a portion of the peripheral reinforcing portion of the wafer by using a cutting tool having a rotational shaft parallel to the holding surface, while rotating the wafer by rotating the holding table after the holding of the wafer; wherein the peripheral reinforcing portion is thinned so as to have a thickness equal to or thinner than that of the device region by the thinning.

2. A processing method for a wafer according to claim 1, wherein the cutting tool has a width equal to or wider than that of the ring-shaped projection, and the cutting tool cuts from a top end surface of the ring-shaped projection in a thickness direction of the wafer, so that the cutting tool cuts and removes at least the ring-shaped projection.

3. A processing method for a wafer according to claim 1, wherein entry amount of the cutting tool with respect to the wafer in a thickness direction of the wafer is set such that an edge of the cutting tool corresponds to the rear surface of the device region, and the cutting tool faces the ring-shaped projection and moves parallel to the holding surface, so that the cutting tool cuts and removes at least the ring-shaped projection.

4. A processing method for a wafer according to claim 1, wherein while the cutting tool moves relatively to the wafer parallel to the holding surface, the cutting tool cuts and removes at least the ring-shaped projection.

5. A processing method for a wafer according to claim 4, wherein the cutting tool moves parallel to an axial direction of the rotational shaft.

6. A processing method for a wafer according to claim 1, wherein a metal film is provided on a region of the rear surface which corresponds to the device region.

* * * * *